(12) United States Patent
Chen et al.

(10) Patent No.: US 7,345,879 B2
(45) Date of Patent: Mar. 18, 2008

(54) HEAT DISSIPATION DEVICE

(75) Inventors: Chun-Chi Chen, Tu Cheng (TW); Shi-Wen Zhou, Shenzhen (CN); Meng Fu, Shenzhen (CN); Dong-Bo Zheng, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 103 days.

(21) Appl. No.: 11/308,847

(22) Filed: May 15, 2006

(65) Prior Publication Data

US 2007/0263358 A1    Nov. 15, 2007

(51) Int. Cl.
    *H05K 7/20* (2006.01)
(52) U.S. Cl. .................. 361/704; 361/707; 361/709; 165/80.3; 165/185; 257/712
(58) Field of Classification Search ............... None
    See application file for complete search history.

(56) References Cited

U.S. PATENT DOCUMENTS

| | | | |
|---|---|---|---|
| 6,307,747 B1 * | 10/2001 | Farnsworth et al. | 361/704 |
| 6,992,895 B2 | 1/2006 | Lindberg | |
| 7,117,929 B2 * | 10/2006 | Curtis et al. | 165/80.3 |
| 7,142,427 B2 * | 11/2006 | Reents | 361/704 |
| 7,154,751 B2 * | 12/2006 | Furuyama et al. | 361/704 |
| 2006/0126305 A1 * | 6/2006 | Xia et al. | 361/704 |

* cited by examiner

*Primary Examiner*—Boris Chèrvinsky
(74) *Attorney, Agent, or Firm*—Jeffrey T. Knapp

(57) ABSTRACT

A heat dissipation device includes a primary heat sink (10) contacting a central processing unit and a secondary heat sink (20) attached on heat-generating electronic components adjacent the central processing unit. The primary heat sink includes a base (12) and a heat-dissipation portion (14) disposed on a middle of the base. The secondary heat sink includes a substrate (22) and a plurality of fin assemblies (24) arranged on the substrate. The base is laid on the substrate with the fin assemblies arranged around the heat-dissipation portion. The primary heat sink is partly superposed on the secondary heat sink with a compact structure. The heat-dissipation portion can simultaneously dissipate heat from the central processing unit and its adjacent heat-generating electronic components.

16 Claims, 3 Drawing Sheets

HEAT DISSIPATION DEVICE

FIELD OF THE INVENTION

The present invention generally relates to a heat dissipation devices for removing heat from a central processing unit (CPU) of a computer and other electronic components around the CPU and particularly to a heat dissipation device which can simultaneously dissipate heat from the CPU and the surrounding electronic components.

DESCRIPTION OF RELATED ART

With the continuing advance of computer technology, electronic components such as central processing units (CPUs) of computers are being made to provide faster operational speeds and greater functional capabilities. When a CPU operates at high speed in a computer enclosure, its temperature can increase greatly. It is therefore desirable to dissipate the heat quickly, for example by using a heat dissipation device attached to the CPU in the enclosure. Furthermore, other electronic components arranged around the CPU also produce a great amount of heat at the same time and this also requires heat dissipation. It is thus also very necessary to dispose heat sinks on the electronic components around the CPU. This allows the CPU and other electronic components around the CPU to function within their normal operating temperature ranges, thereby assuring the quality of data management, storage and transfer.

A conventional heat dissipation device for dissipating the heat produced by the CPU and the electronic components around the CPU comprises a plurality of heat sinks disposed on both the CPU and the electronic components around the CPU. However, this kind of the heat dissipation device has a disadvantage in that it occupies much space in the enclosure and it is complex to install and disassemble the heat sinks onto or from the CPU and the electronic components around the CPU. Thus, a heat dissipation device with a compact structure, which can simultaneously satisfy demands of heat dissipation for the CPU and the electronic components around the CPU, is needed.

SUMMARY OF INVENTION

A heat dissipation device in accordance with a preferred embodiment comprises a primary heat sink contacting a central processing unit thereon and a secondary heat sink attached on heat-generating electronic components adjacent the central processing unit. The primary heat sink includes a base and a heat-dissipation portion disposed on a middle of the base. The secondary heat sink includes a substrate and a plurality of fin assemblies arranged on the substrate. The base of the primary heat sink is laid on the substrate of the secondary heat sink. The fin assemblies of the secondary heat sink are arranged around the heat-dissipation portion of the primary heat sink. A structure of the heat dissipation device with the base being partly superposed on the substrate is compact. The heat dissipation device can simultaneously dissipate heat from the central processing unit and its adjacent heat-generating electronic components.

Other advantages and novel features will become more apparent from the following detailed description of preferred embodiments when taken in conjunction with the accompanying drawings, in which:

BRIEF DESCRIPTION OF DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION

Figure 1:
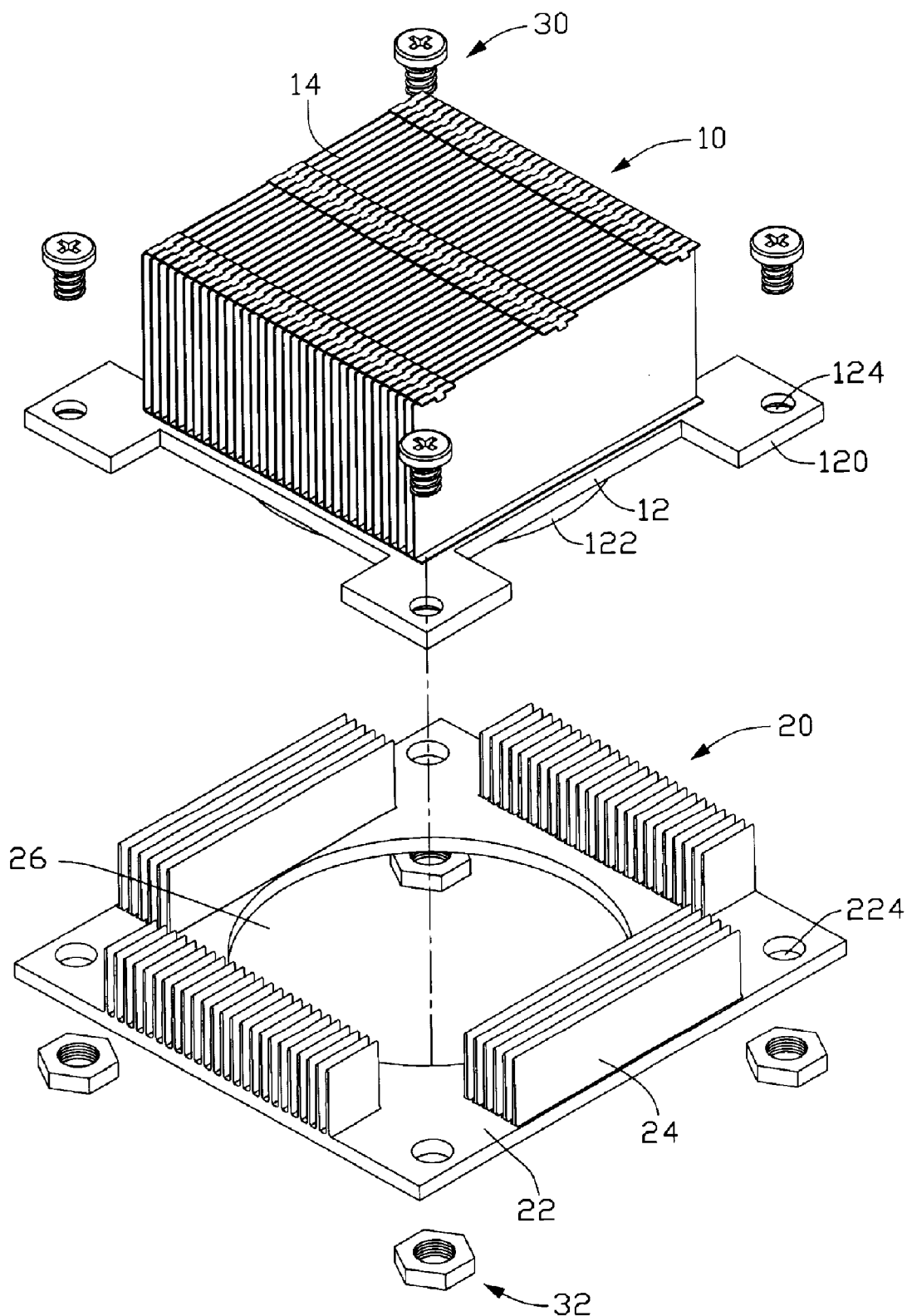
FIG. 1 is an exploded view of a heat dissipation device in accordance with a preferred embodiment of the present invention.
Figure 2:
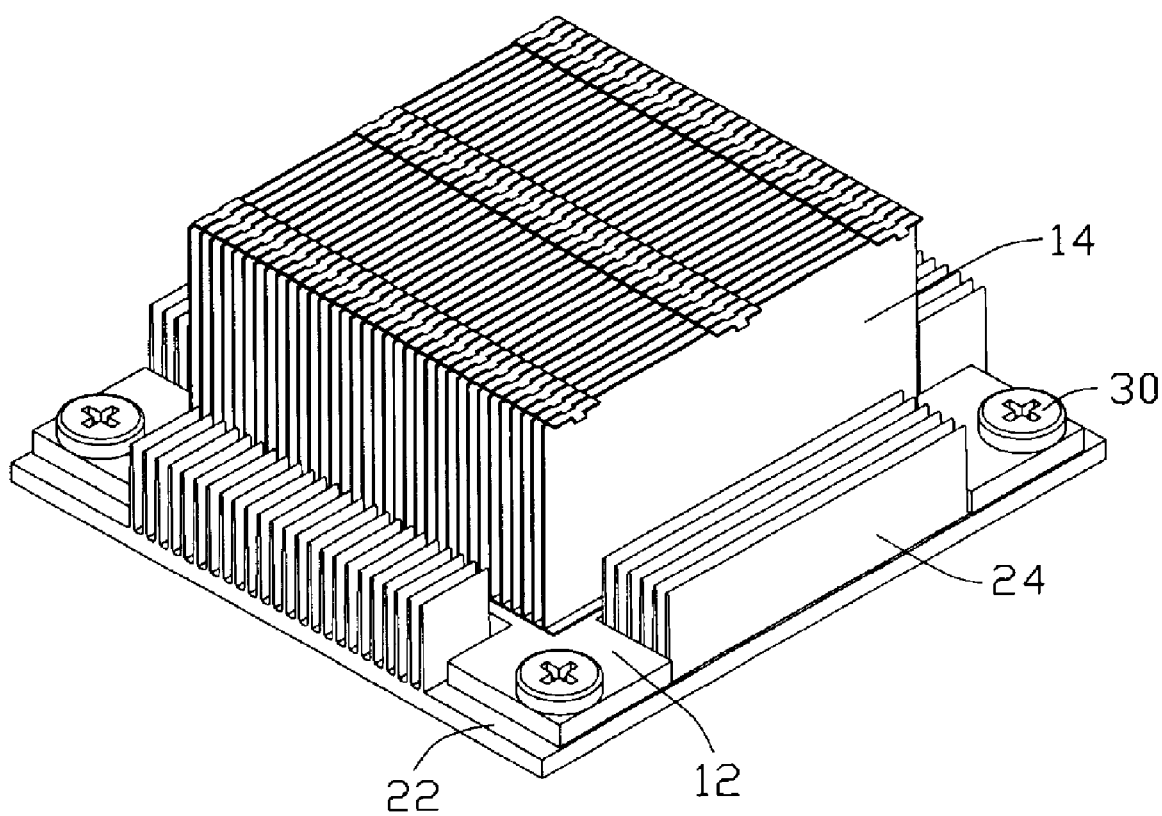
FIG. 2 is an assembled view of FIG. 1.

FIGS. 1-2 show a heat dissipation device in accordance with a preferred embodiment of the present invention. The heat dissipation device comprises a primary heat sink 10 and a secondary heat sink 20 supporting the primary heat sink 10. The primary heat sink 10 comprises a base 12 and a heat-dissipation portion 14 deposited on the base 12. The secondary heat sink 20 comprises a substrate 22 and two pairs of fin assemblies 24 arranged on the substrate 22. The primary heat sink 10 is arranged on a top of the secondary heat sink 20 and the fin assemblies 24 are arranged around the heat-dissipation portion 14.

Figure 3:
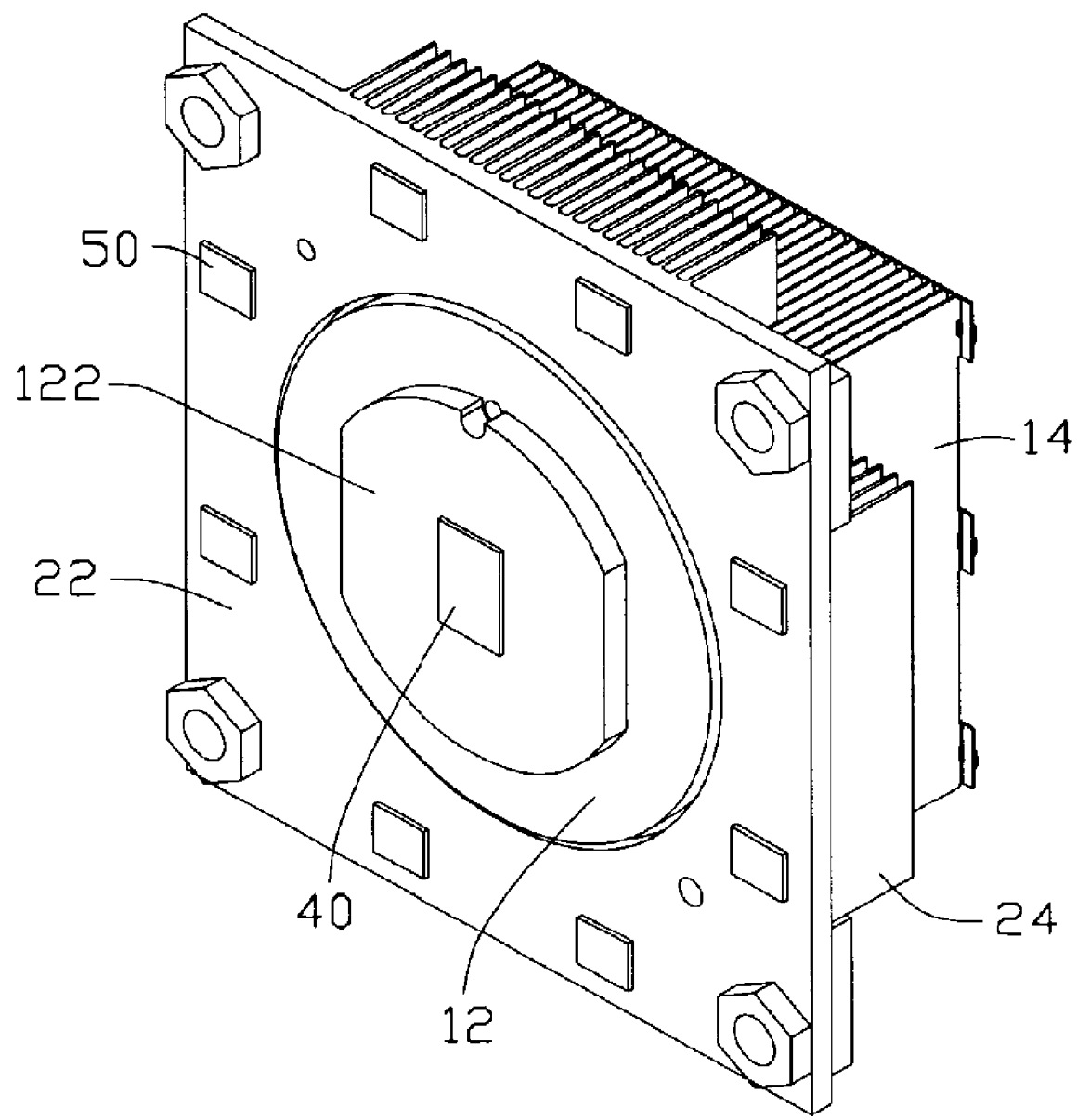
FIG. 3 is a bottom view of the heat dissipation device of FIG. 2 with a CPU and heat-generating electronic components around the CPU.

Referring to FIGS. 1 and 3, the base 12 comprises four feet 120 extending from four corners thereof and a disc-shaped projecting portion 122 on a bottom surface thereof to contact a central processing unit 40 (CPU) on a printed circuit board (not shown). Each foot 120 has a quadrate shape and defines a screw hole 124 therein, for facilitating an installation of the primary heat sink 10 and the secondary heat sink 20 via screws 30 and nuts 32. The substrate 22 is made of heat conductive material and has a quadrate shape. A circular opening 26 is defined in a center of the substrate 22. Four through holes 224 are defined in four separate corners thereof corresponding to the screw holes 124 of the base 12. The fin assemblies 24 are arranged near edges of four sides of the substrate 22 and around the opening 26. Each fin assembly 24 is formed by a plurality of fins arranged in a line and the fin assembly 24 has a rectangular shape. A bottom surface of the substrate 22 corresponding to the fin assemblies 24 is attached on heat-generating electronic components 50 mounted on the printed circuit board and distributed around the CPU 40. The heat-generation electronic components 50 are for example VRMs (voltage regulator modules).

In assembly, the projecting portion 122 of the primary heat sink 10 passes through the opening 26 of the substrate 22 and the feet 120 of the base 12 are attached on a top surface of the substrate 22. The primary heat sink 10 is held by the secondary heat sink 20 and the heat-dissipation portion 14 is surrounded by the fin assemblies 24. Four screws 30 extend through their respective screw holes 124 and into the through holes 224 to engage with four nuts 32, thereby fastening the base 12 of the primary heat sink 10 and the substrate 22 of the secondary heat sink 20 together. The base 12 of the primary heat sink 10 is disposed over the substrate 22 of the secondary heat sink 20 to give the complete heat dissipation device a compact structure.

In operation, when the projecting portion 122 of the base 12 is attached to the CPU 40, heat generated by the CPU 40 is transferred to the base 12 and then to the heat-dissipation portion 14. The heat-generating electronic components 50 around the CPU 40 are attached on a bottom surface of the substrate 22 corresponding to the fin assemblies 24. Accordingly, the heat by generated by the heat-generating electronic components 50 is dissipated quickly. The heat dissipation device can simultaneously dissipate the heat from the CPU 40 and the heat-generating electronic components 50 around the CPU 40.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a primary heat sink comprising a base and a heat-dissipation portion attached on the base; and
   a secondary heat sink comprising a substrate and a plurality of fin assemblies arranged on the substrate;
   wherein the base of the primary heat sink is attached on a top surface of the substrate of the secondary heat sink and the heat-dissipation portion is enclosed by the fin assemblies, a bottom surface of the base corresponding to the heat-dissipation portion being attached on a central processing unit (CPU), a bottom surface of the substrate corresponding to the fin assemblies being attached on heat-generating electronic components around the CPU.

2. The heat dissipation device as claimed in claim 1, wherein the base forms a projecting portion on a bottom thereof for contacting the CPU thereon and the substrate defines an opening in a middle thereof for the projecting portion to pass through.

3. The heat dissipation device as claimed in claim 2, wherein the fin assemblies are arranged around the opening of the substrate.

4. The heat dissipation device as claimed in claim 2, wherein the base comprises four feet which extend from four separate corners thereof to be attached on four corners of the substrate.

5. The heat dissipation device as claimed in claim 4, wherein each foot defines a screw hole therein and the substrate defines four through holes at four corners thereof, for facilitating an installation of the base of the primary heat sink and the substrate of the secondary heat sink via screws and nuts.

6. The heat dissipation device as claimed in claim 5, wherein the projecting portion has a disc shape and the substrate is made of heat conductive material.

7. A heat dissipation device comprising:
   a primary heat sink comprising a base and a heat-dissipation portion arranged on the base, the base having a projecting portion formed on a bottom thereof for contacting with a central processing unit (CPU) thereon; and
   a secondary heat sink comprising a substrate defining an opening in a middle thereof and a plurality of fin assemblies disposed around the opening, a bottom surface of the substrate positioned corresponding to the fin assemblies being attached on heat-generating electronic components around the CPU;
   wherein a part portion of the base contacts on the substrate with the projecting portion passing through the opening and the fin assemblies surround the heat-dissipation portion.

8. The heat dissipation device as claimed in claim 7, wherein the base has four feet extending from four corners thereof and the feet contact on the substrate.

9. The heat dissipation device as claimed in claim 8, wherein the projecting portion has a disc shape and the opening is round for the projecting portion passing through.

10. The heat dissipation device as claimed in claim 9, wherein each foot defines a screw hole and the substrate defines four through holes in the four corners thereof corresponding to the screw holes, for screws screwing into the screw holes and the through holes to engage with nuts to mount the base of the primary heat sink and the substrate of the secondary heat sink together.

11. A heat dissipation device comprising:
   a primary heat sink having a first fin assembly thereon and a projecting portion extending downwardly from a bottom of the primary heat sink just below the first fin assembly; and
   a secondary heat sink having a second fin assembly thereon and an opening therethrough;
   wherein the primary heat sink and the secondary heat sink are assembled together with the projecting portion extending through the opening of the secondary heat sink for contacting with a first heat-generating electronic component, the secondary heat sink having a portion corresponding to the second fin assembly for contacting with a second heat-generating electronic component.

12. The heat dissipation device as claimed in claim 11, wherein the first heat-generating electronic component is a central processing unit and the second heat-generating electronic component is a voltage regulator module.

13. The heat dissipation device as claimed in claim 12, wherein the second fin assembly is arranged surrounding the opening.

14. The heat dissipation device as claimed in claim 13, wherein the opening is circular and the projecting portion has a disc-like shape.

15. The heat dissipation device as claimed in claim 14, wherein the primary heat sink and the secondary heat sink are assembled together by screws extending through the primary and secondary heat sinks.

16. The heat dissipation device as claimed in claim 15, wherein secondary heat sink has a quadrate substrate, the screws extending through four corners of the quadrate substrate.

* * * * *